United States Patent
Kim et al.

(10) Patent No.: US 10,572,058 B2
(45) Date of Patent: Feb. 25, 2020

(54) INTEGRATOR CIRCUIT DEVICE AND OPERATING METHOD THEREOF

(71) Applicant: SAMSUNG ELECTRONICS CO., LTD., Suwon-si (KR)

(72) Inventors: Jinmyoung Kim, Hwaseong-si (KR); Seokwhan Chung, Hwaseong-si (KR)

(73) Assignee: SAMSUNG ELECTORNICS CO., LTD., Suwon-si (KR)

( * ) Notice: Subject to any disclaimer, the term of this patent is extended or adjusted under 35 U.S.C. 154(b) by 8 days.

(21) Appl. No.: 15/472,971

(22) Filed: Mar. 29, 2017

(65) Prior Publication Data
US 2018/0059856 A1    Mar. 1, 2018

(30) Foreign Application Priority Data
Aug. 30, 2016    (KR) .................. 10-2016-0110833

(51) Int. Cl.
G06F 3/044 (2006.01)
G06F 3/041 (2006.01)
H03K 17/96 (2006.01)
H03K 21/08 (2006.01)
G06K 9/00 (2006.01)

(52) U.S. Cl.
CPC ............ *G06F 3/0416* (2013.01); *G06F 3/044* (2013.01); *H03K 17/962* (2013.01); *H03K 21/08* (2013.01); *G06K 9/0002* (2013.01)

(58) Field of Classification Search
CPC ...................................................... G06F 3/044
See application file for complete search history.

(56) References Cited

U.S. PATENT DOCUMENTS

| | | | |
|---|---|---|---|
| 6,900,644 B2 | 5/2005 | Chou et al. |
| 7,030,860 B1 | 4/2006 | Hsu et al. |
| 8,107,212 B2 | 1/2012 | Nelson et al. |
| 8,174,273 B2 | 5/2012 | Geaghan |
| 8,564,314 B2 | 10/2013 | Shaikh et al. |
| 8,599,150 B2 | 12/2013 | Philipp |

(Continued)

FOREIGN PATENT DOCUMENTS

| | | |
|---|---|---|
| JP | 2010-87883 A | 4/2010 |
| JP | 2015-122020 A | 7/2015 |

(Continued)

OTHER PUBLICATIONS

US 9,086,767 B2, 07/2015, Elias et al. (withdrawn)
Communication dated Dec. 19, 2017 by the European Patent Office in counterpart European Patent Application No. 17187326.8.

*Primary Examiner* — Hang Lin
(74) *Attorney, Agent, or Firm* — Sughrue Mion, PLLC

(57) ABSTRACT

An integrator circuit device for integrating an input signal includes an integrator configured to perform integration on an input signal in a positive direction or a negative direction to generate an output voltage, and a switching controller configured to control a switch so that the integrator performs the integration on the input signal in the positive direction or the negative direction. The integrator circuit device further includes a counter configured to count a number of times an integration direction of the integrator is changed, and a controller configured to determine a final output voltage, based on the counted number of times the integration direction is changed and the output voltage.

12 Claims, 12 Drawing Sheets

(56) References Cited

U.S. PATENT DOCUMENTS

| | | |
|---|---|---|
| 8,854,107 B2 | 10/2014 | Kwon et al. |
| 8,867,799 B2 | 10/2014 | Benkley, III |
| 9,141,239 B2 | 9/2015 | Yun et al. |
| 2008/0061800 A1* | 3/2008 | Reynolds ............ G01R 27/2605 324/678 |
| 2009/0167325 A1* | 7/2009 | Geaghan ................ G01D 5/24 324/660 |
| 2011/0115717 A1* | 5/2011 | Hable ................... G06F 3/0416 345/173 |
| 2012/0218020 A1* | 8/2012 | Erdogan ............ G01R 27/2605 327/337 |
| 2013/0162586 A1 | 6/2013 | Erdogan et al. |
| 2014/0071082 A1 | 3/2014 | Singh et al. |
| 2014/0197849 A1 | 7/2014 | Novac |
| 2014/0253491 A1* | 9/2014 | Kwon .................... G06F 3/044 345/174 |
| 2015/0177885 A1 | 6/2015 | Noto |

FOREIGN PATENT DOCUMENTS

| | | |
|---|---|---|
| KR | 10-2011-0105022 A | 9/2011 |
| KR | 10-2011-0125347 A | 11/2011 |
| KR | 10-2017-0050060 A | 5/2017 |

* cited by examiner

INTEGRATOR CIRCUIT DEVICE AND OPERATING METHOD THEREOF

CROSS-REFERENCE TO RELATED APPLICATION

This application claims priority from Korean Patent Application No. 10-2016-0110833, filed on Aug. 30, 2016 in the Korean Intellectual Property Office, the disclosure of which is incorporated herein by reference in its entirety.

BACKGROUND

1. Field

Apparatuses and methods consistent with example embodiments relate to integrator circuit devices and operating methods thereof, and more particularly, to integrator circuit devices for integrating an input signal, and operating methods thereof.

2. Description of the Related Art

Touch sensing is classified into a resistive type and a capacitive type, according to a touch sensing method. In the case of the resistive type, when a touch screen is touched, a touch point is sensed by detecting a change in a resistance at the touch point. In the case of the capacitive type, when a touch screen is touched by an object such as a finger, a touch point is sensed by detecting a change in a capacitance of a capacitor included in the touch screen at the touch point.

In addition, the capacitive type may include a self capacitive type and a mutual capacitive type. In the case of the self capacitive type, when a touch screen is touched by an object such as a finger, a capacitance of a self capacitor included in the touch screen at the touch point increases. On the other hand, in the case of the mutual capacitive type, when a touch screen is touched by an object such as a finger, a capacitance of a mutual capacitor included in the touch screen at the touch point decreases. Regarding the capacitive type, there is a need for a circuit for measuring a change in a capacitance of a capacitor included in a touch screen. An integrator circuit device for integrating a charge quantity stored in a capacitor is used as a circuit for measuring a change in a capacitance of a capacitor.

SUMMARY

Example embodiments may address at least the above problems and/or disadvantages and other disadvantages not described above. Also, the example embodiments may not be required to overcome the disadvantages described above, and may not overcome any of the problems described above.

Example embodiments provide an integrator circuit device capable of expanding a measurable voltage range regardless of a capacitance of a capacitor included in a sensor for sensing a touch input or the like, an operating method thereof, and a sensor including the integrator circuit device.

According to an aspect of an example embodiment, there is provided an integrator circuit device including an integrator configured to perform integration on an input signal in a positive direction or a negative direction to generate an output voltage, and a switching controller configured to control a switch so that the integrator performs the integration on the input signal in the positive direction or the negative direction. The integrator circuit device further includes a counter configured to count a number of times an integration direction of the integrator is changed, and a controller configured to determine a final output voltage, based on the counted number of times the integration direction is changed and the output voltage.

The integrator circuit device may further include a comparator configured to compare the output voltage with a preset voltage, and the switching controller may be further configured to control the switch to change the integration direction of the integrator, based on a result of the comparison.

The preset voltage may include a first threshold voltage and a second threshold voltage greater than the first threshold voltage, and the switching controller may be further configured to, in response to the output voltage being less than or equal to the first threshold voltage or greater than or equal to the second threshold voltage, control the switch to change the integration direction of the integrator.

The preset voltage may include a first threshold voltage and a second threshold voltage greater than the first threshold voltage, and the switching controller may be further configured to, in response to the output voltage being greater than the first threshold voltage and less than the second threshold voltage, control the switch to maintain the integration direction of the integrator.

The preset voltage may include a first threshold voltage and a second threshold voltage greater than the first threshold voltage, and the comparator may be further configured to output a first signal to the switching controller in response to the output voltage being greater than the first threshold voltage and less than the second threshold voltage, and output a second signal to the switching controller in response to the output voltage being less than or equal to the first threshold voltage or greater than or equal to the second threshold voltage.

The integrator may include an operational amplifier, and a feedback capacitor connected to an input terminal and an output terminal of the operation amplifier, the input terminal of the operational amplifier may be connected to a first terminal of a mutual capacitor through a first switch, a first voltage may be applied to the first terminal of the mutual capacitor through a second switch, a second voltage may be applied to a second terminal of the mutual capacitor through a third switch, and a third voltage may be applied to the second terminal of the mutual capacitor through a fourth switch.

The switching controller may be further configured to turn on the first switch and the fourth switch, and turn off the second switch and the third switch, in a first time section, and turn off the first switch and the fourth switch, and turn on the second switch and the third switch, in a second time section, and the integrator may be further configured to perform the integration on the input signal in the positive direction in a time section including the first time section and the second time section that alternately repeat on a time axis.

The switching controller may be further configured to turn on the first switch and the third switch, and turn off the second switch and the fourth switch, in a first time section, and turn off the first switch and the third switch, and turn on the second switch and the fourth switch, in a second time section, and the integrator may be further configured to perform the integration on the input signal in the negative direction in a time section including the first time section and the second time section that alternately repeat on a time axis.

The integrator may be further configured to perform the integration on the input signal a preset number of times, and the controller may be further configured to determine the final output voltage, based on the counted number of times the integration direction is changed and the output voltage, in response to the integrator performing the integration on the input signal the preset number of times.

The integrator circuit device may further include an analog-to-digital converter configured to convert the output voltage into a digital signal.

According to an aspect of an example embodiment, there is provided an operating method of an integrator circuit device, the operating method including performing integration on an input signal in a positive direction or a negative direction to generate an output voltage, changing an integration direction of the integration, based on the output voltage, counting a number of times the integration direction of the integration is changed, and determining a final output voltage, based on the output voltage and the counted number of times the integration direction is changed.

The operating method may further include comparing the output voltage with a preset voltage, and the changing of the integration direction of the integration may include changing the integration direction of the integration, based on a result of the comparing.

The preset voltage may include a first threshold voltage and a second threshold voltage greater than the first threshold voltage, and the changing of the integration direction of the integration may further include changing the integration direction of the integration in response to the output voltage being less than or equal to the first threshold voltage or greater than or equal to the second threshold voltage.

The changing of the integration direction of the integration may further include changing the integration direction of the integration from the negative direction to the positive direction in response to the output voltage being less than or equal to the first threshold voltage, and changing the integration direction of the integration from the positive direction to the negative direction in response to the output voltage being greater than or equal to the second threshold voltage.

The preset voltage may include a first threshold voltage and a second threshold voltage greater than the first threshold voltage, and the operating method may further include maintaining the integration direction of the integration in response to the output voltage being greater than the first threshold voltage and less than the second threshold voltage.

According to an aspect of an example embodiment, there is provided a sensor including a panel including a first capacitor having a first capacitance, and a second capacitor having a second capacitance greater than the first capacitance, an integrator, and a switching controller configured to selectively connect the first capacitor and the second capacitor to the integrator. The integrator is configured to perform integration on a first charge quantity that is stored in the first capacitor to generate an output voltage, in response to the first capacitor being connected to the integrator, and perform integration on a second charge quantity that is stored in the second capacitor to generate the output voltage, in response to the second capacitor being connected to the integrator.

The second capacitor may include capacitors connected to one another.

The capacitors may be connected in parallel.

The switch controller may be further configured to connect the first capacitor to the integrator to perform fingerprint sensing, and connect the second capacitor to the integrator to perform touch sensing.

The integrator may be further configured to perform the integration on the first charge quantity or the second charge quantity in a positive direction or a negative direction, the sensor further may include a comparator configured to compare the output voltage with a first threshold voltage and a second threshold voltage greater than the first threshold voltage, and the switching controller may be further configured to control a switch to change an integration direction of the integrator, based on a result of the comparison.

The switching controller may be further configured to, in response to the output voltage being less than or equal to the first threshold voltage or greater than or equal to the second threshold voltage, control the switch to change the integration direction of the integrator.

The integrator may include an operational amplifier, and a feedback capacitor connected to an input terminal and an output terminal of the operation amplifier, the input terminal of the operational amplifier may be connected to a first terminal of a mutual capacitor through a first switch, a first voltage may be applied to the first terminal of the mutual capacitor through a second switch, a second voltage may be applied to a second terminal of the mutual capacitor through a third switch, and a third voltage may be applied to the second terminal of the mutual capacitor through a fourth switch.

The switching controller may be further configured to turn on the first switch and the fourth switch, and turn off the second switch and the third switch, in a first time section, and turn off the first switch and the fourth switch, and turn on the second switch and the third switch, in a second time section, and the integrator may be further configured to perform the integration on the input signal in the positive direction in a time section including the first time section and the second time section that alternately repeat on a time axis.

The switching controller may be further configured to turn on the first switch and the third switch, and turn off the second switch and the fourth switch, in a first time section, and turn off the first switch and the third switch, and turn on the second switch and the fourth switch, in a second time section, and the integrator may be further configured to perform the integration on the input signal in the negative direction in a time section including the first time section and the second time section that alternately repeat on a time axis.

The sensor may further include a counter configured to count a number of times the integration direction of the integrator is changed, and a controller configured to determine a final output voltage corresponding to the first capacitor or the second capacitor, based on the counted number of times the integration direction is changed and the output voltage.

The controller may be further configured to, in response to the determined final output voltage corresponding to the second capacitor being greater than or equal to a preset voltage, determine that a point corresponding to the second capacitor is touched.

The controller may be further configured to determine a pixel value of a point corresponding to the first capacitor, based on the determined final output voltage corresponding to the first capacitor, and sense a fingerprint, based on an image that is generated based on the determined pixel value.

According to an aspect of an example embodiment, there is provided an integrator circuit device including an integrator configured to perform positive integration on an input signal in a positive direction to generate an output voltage, and perform negative integration on the input signal in a negative direction to generate the output voltage. The integrator circuit device further includes a switching controller configured to control a switch to change an integration direction of the integrator from the positive direction to a negative direction in response to the output voltage being greater than or equal to a first threshold voltage, and change the integration direction of the integrator from the negative direction to the positive direction in response to the output voltage being less than or equal to a second threshold voltage less than the first threshold voltage. The integrator circuit device further includes a counter configured to count a number of times the integration direction of the integrator is changed, and a controller configured to determine a final output voltage, based on the counted number of times the integration direction is changed and the output voltage.

The controller may be further configured to count a number of times the positive integration and the negative integration of the input signal are performed, and determine the final output voltage, based on the counted number of times the integration direction is changed and the output voltage, in response to the counted number of times the positive integration and the negative integration are performed being equal to a preset number.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
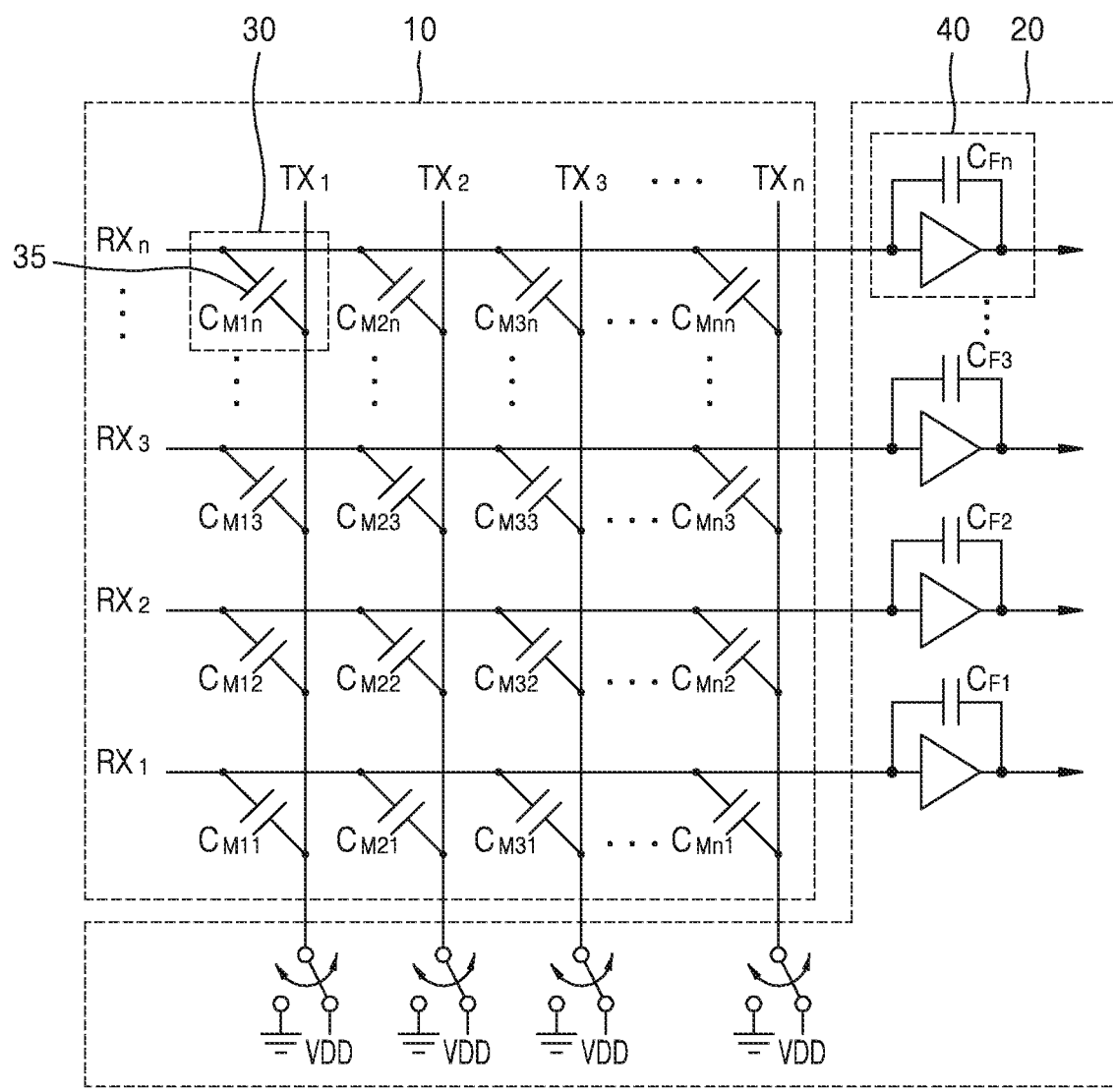
FIG. 1 is a configuration diagram of a touch and fingerprint sensor including an integrator circuit device, according to an example embodiment.

Reference will now be made in detail to example embodiments, examples of which are illustrated in the accompanying drawings, wherein like reference numerals refer to like elements throughout. In this regard, the present example embodiments may have different forms and may not be construed as being limited to the descriptions set forth herein. Accordingly, the example embodiments are described below, by referring to the figures, to explain aspects.

All terms including descriptive or technical terms used herein may be construed as having meanings that are obvious to those of ordinary skill in the art. However, the terms may have different meanings according to an intention of those of ordinary skill in the art, precedent cases, or the appearance of new technologies. Also, some terms may be arbitrarily selected by the applicant. In this case, the meaning of the selected terms will be described in the detailed description. Thus, the terms used herein have to be defined based on the meaning of the terms together with the description throughout the specification.

Also, when a part "includes" or "comprises" an element, unless there is a description contrary thereto, the part can further include other elements, not excluding the other elements. In the following description, terms such as "unit" and "module" indicate a unit for processing at least one function or operation, wherein the unit and the module may be embodied as hardware or software or embodied by combining hardware and software.

Hereinafter, the example embodiments will be described with reference to the accompanying drawings in such a manner that the example embodiments may be easily carried out by those of ordinary skill in the art. However, the inventive concept may be implemented in various forms and is not limited to the example embodiments.

FIG. 1 is a configuration diagram of a touch and fingerprint sensor including an integrator circuit device, according to an example embodiment.

Referring to FIG. 1, the touch and fingerprint sensor may include a touch panel 10 and a sensing circuit 20.

The touch panel 10 may include a plurality of operation lines $TX_1$, $TX_2$, $TX_3$, ..., $TX_n$, and a plurality of sensing lines $RX_1$, $RX_2$, $RX_3$, ..., $RX_n$. The plurality of operation lines $TX_1$, $TX_2$, $TX_3$, ..., $TX_n$ and the plurality of sensing lines $RX_1$, $RX_2$, $RX_3$, ..., $RX_n$ are insulated from one another. In FIG. 1, the plurality of operation lines $TX_1$, $TX_2$, $TX_3$, ..., $TX_n$ and the plurality of sensing lines $RX_1$, $RX_2$, $RX_3$, ..., $RX_n$ are illustrated as lines for convenience of description, but may be implemented as electrode patterns. Also, in FIG. 1, the plurality of operation lines $TX_1$, $TX_2$, $TX_3$, ..., $TX_n$ and the plurality of sensing lines $RX_1$, $RX_2$, $RX_3$, ..., $RX_n$ are illustrated as intersecting with one another while being insulated from one another, but example embodiments are not limited thereto.

A sensing node 30 indicating a touch point may be defined by one sensing line and one operation line and may include a sampling capacitor 35. The sampling capacitor 35 may be electrically connected to the sensing line and the operation line defining the sensing node 30. For example, a first terminal of the sampling capacitor 35 may be connected to the sensing line, and a second terminal of the sampling capacitor 35 may be connected to the operation line. Referring to FIG. 1, a sampling capacitor defined between an $i^{th}$ operation line $TX_i$ and a $j^{th}$ sensing line $RX_j$ may be denoted as $C_{Mij}$. The sampling capacitor 35 may include a first sampling capacitor having a first capacitance for sensing a fingerprint and a second sampling capacitor having a second capacitance for sensing a touch. In this regard, the second capacitance may be greater than the first capacitance. In addition, the first sampling capacitor and the second sampling capacitor may be separate capacitors, or the second sampling capacitor may include a plurality of first sampling capacitors. For example, the plurality of first sampling capacitors may be connected to one another to constitute the second sampling capacitor. In this case, the plurality of first sampling capacitors may be connected in parallel. However, example embodiments are not limited thereto.

The sensing circuit 20 may be electrically connected to the plurality of operation lines $TX_1, TX_2, TX_3, \ldots, TX_n$ and the plurality of sensing lines $RX_1, RX_2, RX_3, \ldots, RX_n$. In addition, the sensing circuit 20 may apply a voltage to each of the plurality of operation lines $TX_1, TX_2, TX_3, \ldots, TX_n$. For example, the sensing circuit 20 may perform switching so that the plurality of operation lines $TX_1, TX_2, TX_3, \ldots, TX_n$ are connected to a first voltage or a second voltage. In addition, the sensing circuit 20 may include a plurality of integrators 40 each including an operational amplifier and a feedback capacitor $C_{Fj}$. The plurality of sensing lines $RX_1, RX_2, RX_3, \ldots, RX_n$ may be connected to the plurality of integrators 40, respectively. In this case, when a voltage VDD is applied to an $i^{th}$ operation line $TX_i$, electric charges ($Q=C_{Mij} \times VDD$) generated by the applied voltage VDD and the sampling capacitor $C_{Mj}$ may be accumulated in a feedback capacitor $C_{Fj}$ of a $j^{th}$ integrator connected to a $j^{th}$ sensing line. This operation may be repeated a preset number of times of integration. A final voltage obtained through the repeated operations may be output from the integrator 40.

The final voltage output from the integrator 40 may be converted into digital data through an analog-to-digital converter (ADC). Various filtering operations may be performed on the digital data to output an image.

The sensing circuit 20 may measure a change amount of the output voltage (or a change amount of capacitance), based on the final voltage output from the integrator 40. Accordingly, the sensing circuit 20 may sense a touch point touched by a user or a fingerprint of the user.

Figure 2:
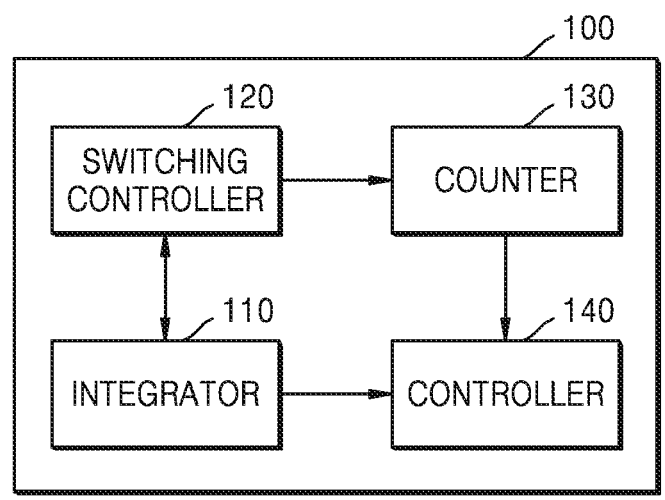
FIG. 2 is a block diagram of an integrator circuit device according to an example embodiment.

FIG. 2 is a block diagram of an integrator circuit device 100 according to an example embodiment.

Referring to FIG. 2, the integrator circuit device 100 according to the example embodiment may include an integrator 110, a switching controller 120, a counter 130, and a controller 140.

The integrator 110 may perform integration on an input signal in a positive direction or a negative direction. For example, the integrator 110 may perform integration on a charge quantity stored in the sampling capacitor 35 of FIG. 1 in the positive direction or the negative direction.

The integrator 110 may include an operational amplifier and a feedback capacitor configured to connect an input terminal to an output terminal of the operational amplifier. The input terminal of the operational amplifier may be connected to a first terminal of a sampling capacitor through a first switch, and a first voltage may be applied to the first terminal of the sampling capacitor through a second switch. A second voltage may be applied to a second terminal of the sampling capacitor through a third switch, and a third voltage may be applied to the second terminal of the sampling capacitor through a fourth switch. The integrator 110 may perform integration on the input signal a preset number of times.

The switching controller 120 may control at least one switch so that the integrator 110 performs integration on the input signal in the positive direction or the negative direction. The switching controller 120 may control at least one switch to change an integration direction of the integrator 110, based on a result of comparison between a voltage output from the integrator 110 and a preset voltage. For example, when the voltage output from the integrator 110 is less than or equal to a first threshold voltage or greater than or equal to a second threshold voltage greater than the first threshold voltage, the switching controller 120 may control at least one switch to change the integration direction of the integrator 110. Alternatively, when the voltage output from the integrator 110 is greater than the first threshold voltage and less than the second threshold voltage, the switching controller 120 may control at least one switch to maintain the integration direction of the integrator 110.

The switching controller 120 may turn on the first switch and the fourth switch and turn off the second switch and the third switch in a first section. The switching controller 120 may turn off the first switch and the fourth switch and turn on the second switch and the third switch in a second section. The first section and the second section may alternately repeat on a time axis. The integrator 110 may perform integration on the input signal in the positive direction in a time section including the first section and the second section.

The switching controller 120 may turn on the first switch and the third switch and turn off the second switch and the fourth switch in a third section. The switching controller 120 may turn off the first switch and the third switch and turn on the second switch and the fourth switch in a fourth section. The third section and the fourth section may alternately repeat on a time axis. The integrator 110 may perform integration on the input signal in the negative direction in a time section including the third section and the fourth section.

In addition, the switching controller 120 may perform control so that the first sampling capacitor or the second sampling capacitor included in the touch panel 10 of FIG. 1 is selectively connected to the integrator 110. For example, in the case of fingerprint sensing, the switching controller 120 may perform control so that the first sampling capacitor is connected to the integrator 110. In the case of touch sensing, the switching controller 120 may perform control so that the second sampling capacitor is connected to the integrator 110.

The counter 130 may count the number of times the integration direction of the integrator 110 changed.

The controller 140 may determine a final output voltage, based on the number of times the integration direction of the integrator 110 changed and the voltage output from the integrator 110. The controller 140 may detect a touch point or a fingerprint of a user based on the final output voltage.

Figure 3:
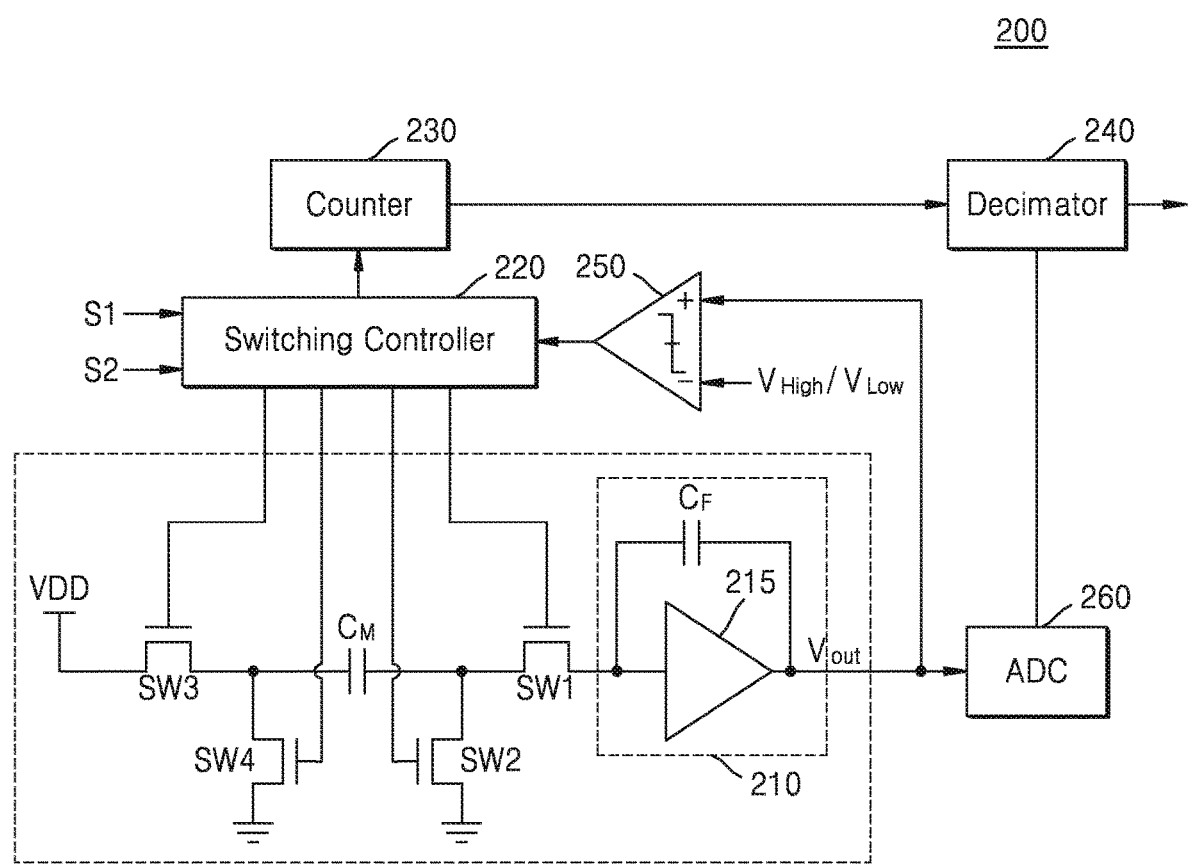
FIG. 3 is a configuration diagram of an integrator circuit device according to an example embodiment.

FIG. 3 is a configuration diagram of an integrator circuit device 200 according to an example embodiment.

Referring to FIG. 3, the integrator circuit device 200 according to the example embodiment may include an integrator 210, first to fourth switches SW1, SW2, SW3, and SW4, a mutual capacitor $C_M$, a switching controller 220, a counter 230, a comparator 250, an ADC 260, and a decimator 240. In addition, the integrator 210 may include an operational amplifier 215 and a feedback capacitor $C_F$.

An input terminal of the operational amplifier 215 may be connected to a first terminal of the mutual capacitor $C_M$ through the first switch SW1, and a first voltage may be applied to the first terminal of the mutual capacitor $C_M$ through the second switch SW2. In this case, the first voltage may have a value of zero (ground voltage (GND)). In addition, a second voltage may be applied to a second terminal of the mutual capacitor $C_M$ through the third switch SW3, and a third voltage may be applied to the second terminal of the mutual capacitor $C_M$ through the fourth switch SW4. In this case, the second voltage may have a power supply voltage VDD, and the third voltage may have a value of zero (ground voltage (GND)). The mutual capacitor $C_M$ may be charged with the power supply voltage VDD, or may be discharged to the ground voltage (GND) according to a connection state with respect to the first to third voltage.

The mutual capacitor $C_M$ of FIG. 3 corresponds to the sampling capacitor $C_{ij}$ described with reference to FIG. 1. A charging and discharging operation of the mutual capacitor $C_M$ may be performed a preset number of times (N times).

The integrator 210 may perform integration on an input signal in a positive direction or a negative direction. The integrator 210 may include the operational amplifier 215 and the feedback capacitor $C_F$, and an input terminal of the operational amplifier 215 may be connected through the feedback capacitor $C_F$ to an output terminal of the operational amplifier 215.

The integrator 210 may perform integration on a charge quantity ($Q=C_M \times VDD$) stored in the mutual capacitor $C_M$ in a positive direction or a negative direction. Whenever the integrator 210 performs integration once in the positive direction, an output voltage $V_{out}$ of the integrator 210 may increase by $C_M \times VDD/C_F$. Whenever the integrator 210 performs integration once in the negative direction, the output voltage of the integrator 210 may decrease by $C_M \times VDD/C_F$.

A method of operating the first to fourth switches SW1 to SW4 when the integrator 210 performs integration in the positive direction and the negative direction will be described below in detail with reference to FIGS. 4 and 5.

The ADC 260 may convert the voltage output from the integrator 210 into a digital signal.

The switching controller 220 may control the first to fourth switches SW1 to SW4. An integration direction of the integrator 210 may be determined according to a connection state between the first to fourth switches SW1 to SW4 and the mutual capacitor $C_M$.

The comparator 250 may compare the voltage output from the integrator 210 with a preset voltage. In this case, the preset voltage may include a first threshold voltage $V_{Low}$ and a second threshold voltage $V_{High}$ greater than the first threshold voltage $V_{Low}$. The first threshold voltage $V_{Low}$ and the second threshold voltage $V_{High}$ may be determined based on a minimum threshold voltage and a maximum threshold voltage capable of operating the operational amplifier 215.

The switching controller 220 may control the first to fourth switches SW1 to SW4, based on a comparison result of the comparator 250. The switching controller 220 may determine a change of the integration direction of the integrator 210, based on a signal output from the comparator 250.

For example, when the voltage output from the integrator 210 is greater than the first threshold voltage $V_{Low}$ and less than the second threshold voltage $V_{High}$, the comparator 250 may output a first signal to the switching controller 220. When the voltage output from the integrator 210 is less then or equal to the first threshold voltage $V_{Low}$ or greater than or equal to the second threshold voltage $V_{High}$, the comparator 250 may output a second signal to the switching controller 220.

When the switching controller 220 receives the first signal from the comparator 250, the switching controller 220 may control the first to fourth switches SW1 to SW4 to maintain a current integration direction. On the other hand, when the switching controller 220 receives the second signal from the comparator 250, the switching controller 220 may control the first to fourth switches SW1 to SW4 to change a current integration direction. For example, when the switching controller 220 receives the second signal while the first to fourth switches SW1 to SW4 operate so that the integrator 210 performs integration in the positive direction, the switching controller 220 may control the operations of the first to fourth switches SW1 to SW4 so that the integrator 210 performs integration in the negative direction. On the other hand, when the switching controller 220 receives the second signal while the first to fourth switches SW1 to SW4 operate so that the integrator 210 performs integration in the negative direction, the switching controller 220 may control the operations of the first to fourth switches SW1 to SW4 so that the integrator 210 performs integration in the positive direction.

The switching controller 220 may apply one of a first clock signal S1 and a second clock signal S2 to each of the first to fourth switches SW1 to SW4. In this case, the first clock signal S1 may be a signal opposite the second clock signal S2. For example, in a section in which the first clock signal S1 is turned on, the second clock signal S2 may be turned off, and in a section in which the first clock signal S1 is turned off, the second clock signal S2 may be turned on. However, example embodiments are not limited thereto.

The counter 230 may count the number of times the integration direction of the integrator 210 changed. In this case, the switching controller 220 may output, to the counter 230, a signal indicating whether a signal pattern applied to the first to fourth switches SW1 to SW4 is changed. For example, when a state in which the first clock signal S1 is applied to the first switch SW1 and the fourth switch SW4 and the second clock signal S2 is applied to the second switch SW2 and the third switch SW3 is changed to a state in which the second clock signal S2 is applied to the second switch SW2 and the fourth switch SW4 and the first clock signal S1 is applied to the first switch SW1 and the third switch SW3, the switching controller 220 may output to the counter 230 a signal indicating that the signal pattern is changed.

The decimator 240 may determine a final output voltage, based on the number of times the integration direction changed and the voltage output from the integrator 210. The decimator 240 may receive a signal indicating the number of times the integration direction of the integrator 210 changed from the counter 230, receive the digital signal corresponding to the voltage output from the integrator 210 from the ADC 260, and determine the final output voltage. For example, when the integration direction of the integrator 210 is initially the positive direction and is changed twice, the decimator 240 may determine $2\times(V_{High}-V_{Low})+V_{out}$ as the final output voltage. When the integration direction of the integrator 210 is initially the negative direction and is changed twice, the decimator 240 may determine $2\times(V_{High}-V_{Low})+(V_{High}-V_{out})$ as the final output voltage.

Figure 4A:
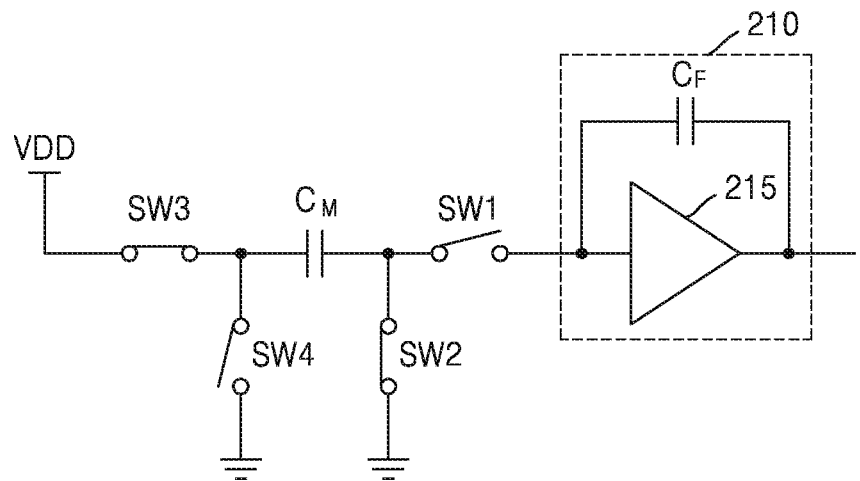
FIGS. 4A, 4B, and 4C are diagrams for describing a method of operating switches when an integrator performs integration in a positive direction, according to an example embodiment.
Figure 4B:
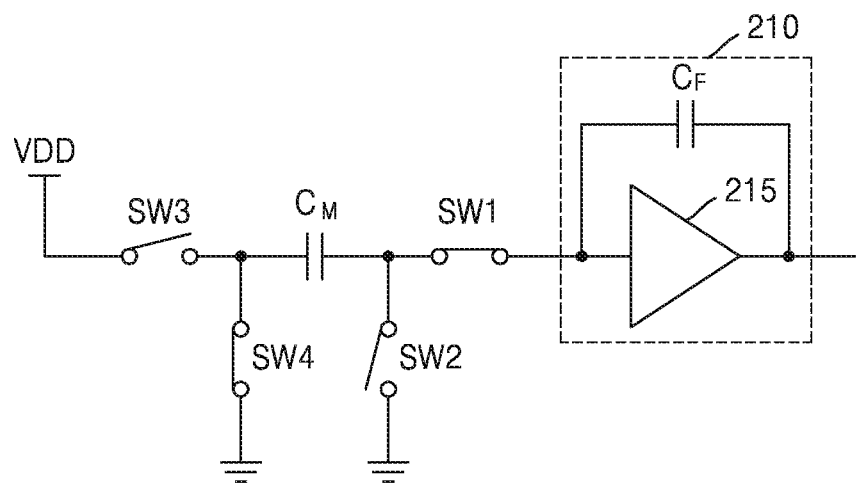
Figure 4C:
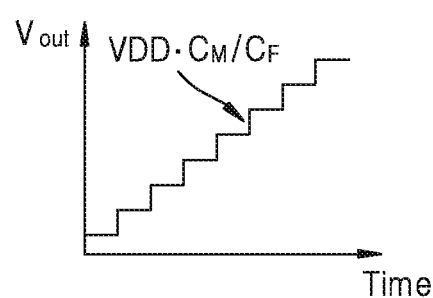

FIGS. 4A, 4B, and 4C are diagrams for describing a method of operating the switches SW1, SW2, SW3, and SW4 when the integrator 210 performs integration in a positive direction, according to an example embodiment.

As illustrated in FIG. 4A, a section in which the integrator 210 performs integration in the positive direction may include a first section in which the second switch SW2 and the third switch SW3 operate in an on-state and the first switch SW1 and the fourth switch SW4 operate in an off-state. In addition, as illustrated in FIG. 4B, the section in which the integrator 210 performs integration in the positive direction may include a second section in which the second switch SW2 and the third switch SW3 operate in an off-state and the first switch SW1 and the fourth switch SW4 operate in an on-state. The first section and the second section may alternately repeat on a time axis.

Referring to FIG. 4A, when the second switch SW2 and the third switch SW3 are in an on-state and the first switch SW1 and the fourth switch SW4 are in an off-state, the ground voltage (GND) may be applied to the first terminal of the mutual capacitor $C_M$, and the power supply voltage VDD may be applied to the second terminal of the mutual capacitor $C_M$. Thus, a voltage difference between the first terminal and the second terminal of the mutual capacitor $C_M$ may be equal to the power supply voltage VDD. In this case, a charge quantity of $VDD \times C_M$ may be stored in the mutual capacitor $C_M$.

Referring to FIG. 4B, when the second switch SW2 and the third switch SW3 are in an off-state and the first switch SW1 and the fourth switch SW4 are in an on-state, the ground voltage (GND) may be applied to the second terminal of the mutual capacitor $C_M$, and the first terminal of the mutual capacitor $C_M$ may be connected to the input terminal of the operational amplifier 215.

In this case, electric charges stored in the mutual capacitor $C_M$ may be transferred to the integrator 210. Thus, the mutual capacitor $C_M$ may be discharged, and the feedback capacitor $C_F$ may be charged. Therefore, the output voltage $V_{out}$ of the integrator 210 may increase by a value obtained according to Equation 1 below:

$$\Delta V_{out} = VDD \times C_M / C_F.$$ [Equation 1]

When a charging/discharging operation of the mutual capacitor $C_M$ is performed n times, electric charges stored in the feedback capacitor $C_F$ are not discharged. Accordingly, the output voltage $V_{out}$ of the integrator 210 may increase by $n \times VDD \times C_M / C_F$. For example, as illustrated in FIG. 4C, the output voltage $V_{out}$ of the integrator 210 may increase stepwise FIGS. 5A, 5B, and 5C are diagrams for describing a method of operating the switches SW1, SW, SW3, and SW4 when the integrator 210 performs integration in a negative direction, according to an example embodiment.

Figure 5A:
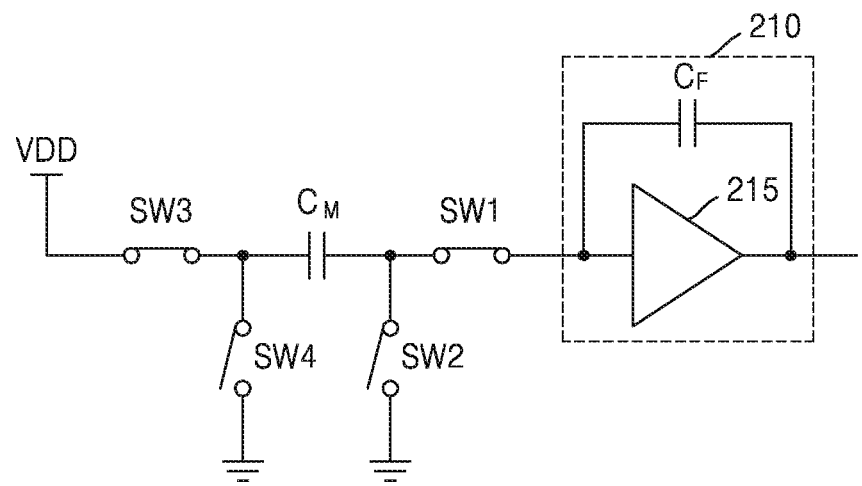
FIGS. 5A, 5B, and 5C are diagrams for describing a method of operating switches when an integrator performs integration in a negative direction, according to an example embodiment.
Figure 5B:
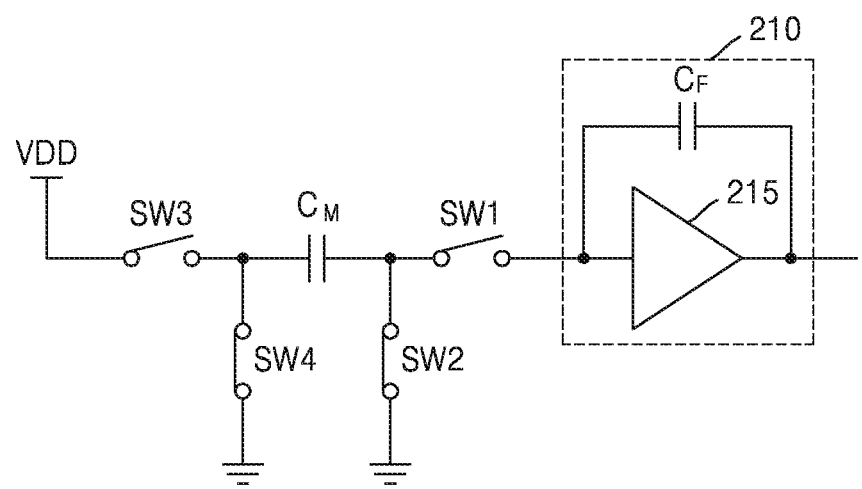
Figure 5C:
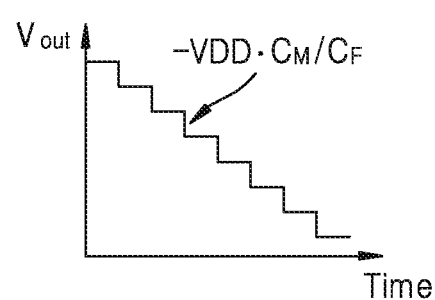

Referring to FIG. 5A, a section in which the integrator 210 performs integration in the negative direction may include a third section in which the first switch SW1 and the third switch SW3 operate in an on-state and the second switch SW2 and the fourth switch SW4 operate in an off-state. In addition, referring to FIG. 5B, the section in which the integrator 210 performs integration in the negative direction may include a fourth section in which the first switch SW1 and the third switch SW3 operate in an off-state and the second switch SW2 and the fourth switch SW4 operate in an on-state. The third section and the fourth section may alternately repeat on a time axis.

Referring to FIG. 5A, when the first switch SW1 and the third switch SW3 are in an on-state and the second switch SW2 and the fourth switch SW4 are in an off-state, the power supply voltage VDD may be applied to the second terminal of the mutual capacitor $C_M$, and the first terminal of the mutual capacitor $C_M$ may be connected to the input terminal of the operational amplifier 215. A voltage at the input terminal of the operational amplifier 215 may be 0 V. A voltage difference between the first terminal and the second terminal of the mutual capacitor $C_M$ may be equal to the power supply voltage VDD. A current flowing through the mutual capacitor $C_M$ flows through the feedback capacitor $C_F$. Therefore, the output voltage $V_{out}$ of the integrator 210 may decrease by a value obtained according to Equation 2 below:

$$\Delta V_{out} = -VDD \times C_M / C_F.$$ [Equation 2]

Referring to FIG. 5B, when the first switch SW1 and the third switch SW3 are in an off-state and the second switch SW2 and the fourth switch SW4 are in an on-state, the ground voltage (GND) may be applied to the first terminal and the second terminal of the mutual capacitor $C_M$. In this case, a voltage at the first terminal of the mutual capacitor $C_M$ may instantaneously decrease to $-VDD$. However, because the ground voltage (GND) is applied to the first terminal of the mutual capacitor $C_M$, the voltage at the first terminal of the mutual capacitor $C_M$ may increase to the ground voltage (GND) while electric charges of the mutual capacitor $C_M$ are discharged.

Therefore, when a charging/discharging operation of the mutual capacitance $C_M$ is performed n times, electric charges stored in the feedback capacitor $C_F$ are not discharged. Accordingly, the output voltage $V_{out}$ of the integrator 210 may decrease by $n \times VDD \times C_M / C_F$. For example, as illustrated in FIG. 5C, the output voltage $V_{out}$ of the integrator 210 may decrease stepwise.

Figure 6:
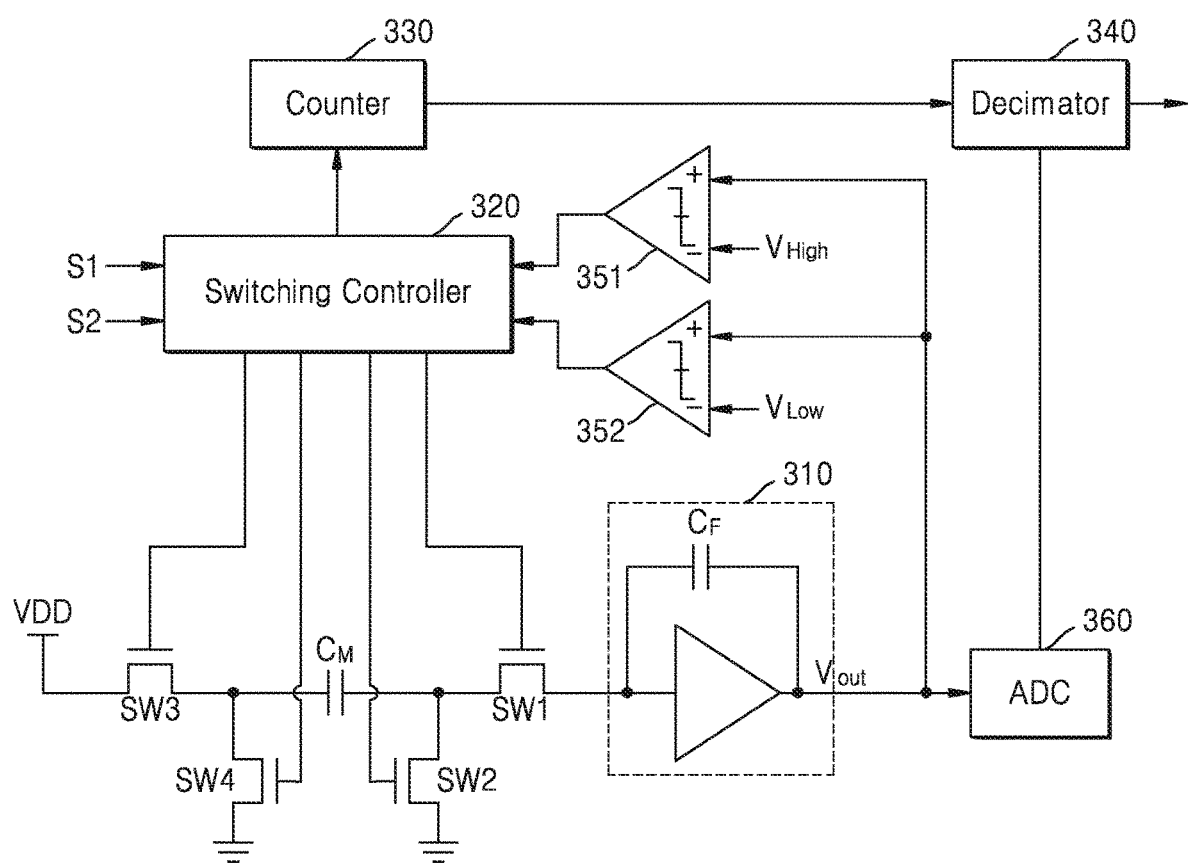
FIG. 6 is a configuration diagram of an integrator circuit device according to an example embodiment.

FIG. 6 is a configuration diagram of an integrator circuit device according to an example embodiment.

Referring to FIG. 6, the integrator circuit device according to the example embodiment may include an integrator 310, first to fourth switches SW1 to SW4, a mutual capacitor $C_M$, a switching controller 320, a counter 330, a first comparator 351, a second comparator 352, an ADC 360, and a decimator 340.

Because the integrator 310, the first to fourth switches SW1 to SW4, the mutual capacitor $C_M$, the switching controller 320, the counter 330, the ADC 360, and the decimator 340 of FIG. 6 respectively correspond to the integrator 210, the first to fourth switches SW1 to SW4, the mutual capacitor $C_M$, the switching controller 220, the counter 230, the ADC 260, and the decimator 240 described with reference to FIG. 3, redundant descriptions thereof will be omitted.

The first comparator 351 and the second comparator 352 may compare a voltage output from the integrator 310 with a preset voltage. For example, the first comparator 351 may compare the voltage output from the integrator 310 with a second threshold voltage $V_{High}$ and determine whether the voltage output from the integrator 310 is less than the second threshold voltage $V_{High}$. When the voltage output from the integrator 310 is less than the second threshold voltage $V_{High}$, the first comparator 351 may output a first signal to the switching controller 320. In addition, when the voltage output from the integrator 310 is greater than or equal to the second threshold voltage $V_{High}$, the first comparator 351 may output a second signal to the switching controller 320.

The second comparator 352 may compare the voltage output from the integrator 310 with a first threshold voltage $V_{Low}$ and determine whether the voltage output from the integrator 310 is greater than the first threshold voltage $V_{Low}$. When the voltage output from the integrator 310 is greater than the first threshold voltage $V_{Low}$, the second comparator 352 may output the first signal to the switching controller 320. In addition, when the voltage output from the integrator 310 is less than or equal to the first threshold voltage $V_{Low}$, the second comparator 352 may output the second signal to the switching controller 320.

The switching controller 320 may control the first to fourth switches SW1 to SW4 based on signals respectively output from the first comparator 351 and the second comparator 352. For example, when both the first comparator 351 and the second comparator 352 output the first signal, the switching controller 320 may control the first to fourth switches SW1 to SW4 to maintain a current integration direction. On the other hand, when the first comparator 351 or the second comparator 352 outputs the second signal, the switching controller 320 may control the first to fourth switches SW1 to SW4 to change the current integration direction. Because the method of operating the first to fourth switches SW1 to SW4 according to the integration direction has been described above, redundant descriptions thereof will be omitted.

Figure 7:
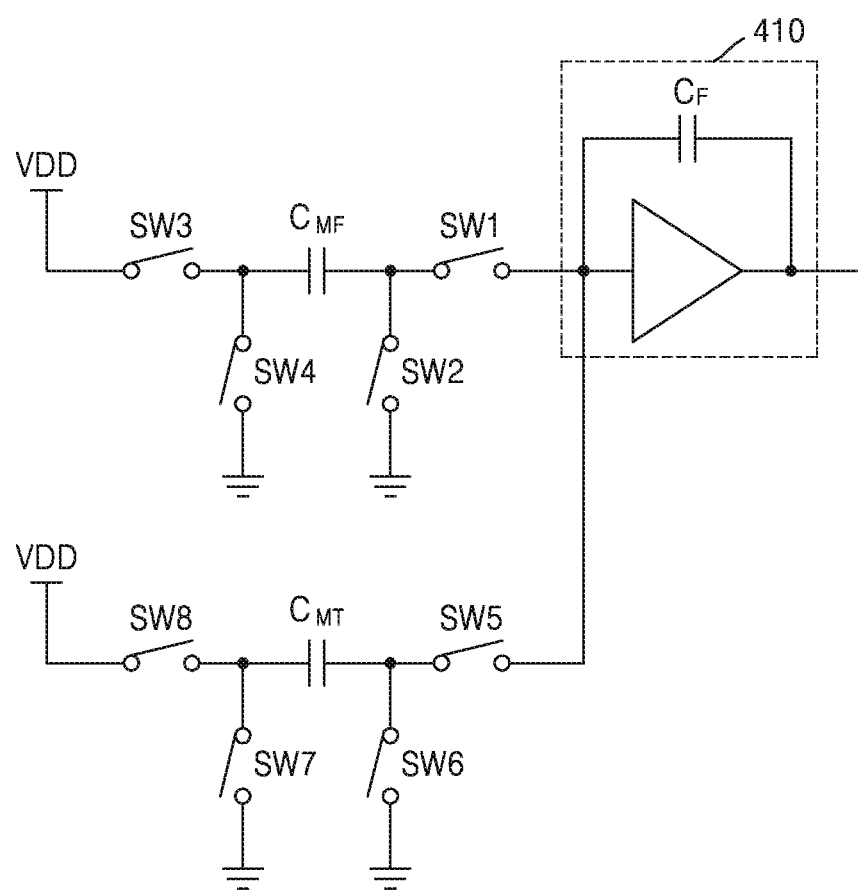
FIG. 7 is a configuration diagram of an integrator circuit device in a touch and fingerprint sensor, according to an example embodiment.

FIG. 7 is a configuration diagram of an integrator circuit device in a touch and fingerprint sensor, according to an example embodiment.

Referring to FIG. 7, a touch panel according to an example embodiment may include a first sampling capacitor $C_{MF}$ having a first capacitance and a second sampling capacitor $C_{MT}$ having a second capacitance greater than the first capacitance. For example, the first sampling capacitor $C_{MF}$ may be a sampling capacitor for sensing a fingerprint input, and the second sampling capacitor $C_{MT}$ may be a sampling capacitor for sensing a touch input. As illustrated in FIG. 7, the first sampling capacitor $C_{MF}$ and the second sampling capacitor $C_{MT}$ may be different separate capacitors.

An integrator 410 according to an example embodiment may be connected to the first sampling capacitor $C_{MF}$ through a first switch SW1, and may be connected to the second sampling capacitor $C_{MT}$ through a fifth switch SW5. The integrator circuit device may connect one of the first sampling capacitor $C_{MF}$ to the second sampling capacitor $C_{MT}$ to the integrator 410 through an on/off operation of the first switch SW1 and the fifth switch SW5. The integrator 410 may perform integration on one of a charge quantity stored in the first sampling capacitor $C_{MF}$ and a charge quantity stored in the second sampling capacitor $C_{MT}$ in a positive direction or a negative direction.

For example, when a fingerprint input is to be sensed, the integrator circuit device may perform integration on the charge quantity stored in the first sampling capacitor $C_{MF}$ in the positive direction or the negative direction by turning off the fifth switch SW5 and controlling first to fourth switches SW1 to SW4 in the same manner as described with reference to FIGS. 4 and 5. In addition, the integrator circuit device may perform integration a preset number of times (N times) and determine a final output voltage, based on a voltage output from the integrator 410 and the number of times an integration direction changed.

Furthermore, a touch input is to be sensed, the integrator circuit device may perform integration on the charge quantity stored in the second sampling capacitor $C_{MT}$ in the positive direction or the negative direction by turning off the first switch SW1 and controlling fifth to eighth switches SW5 to SW8 in the same manner as described with reference to FIGS. 4 and 5. In addition, the integrator circuit device may perform integration a preset number of times (N times) and determine the final output voltage, based on the voltage output from the integrator 410 and the number of times the integration direction changed.

Figure 8:
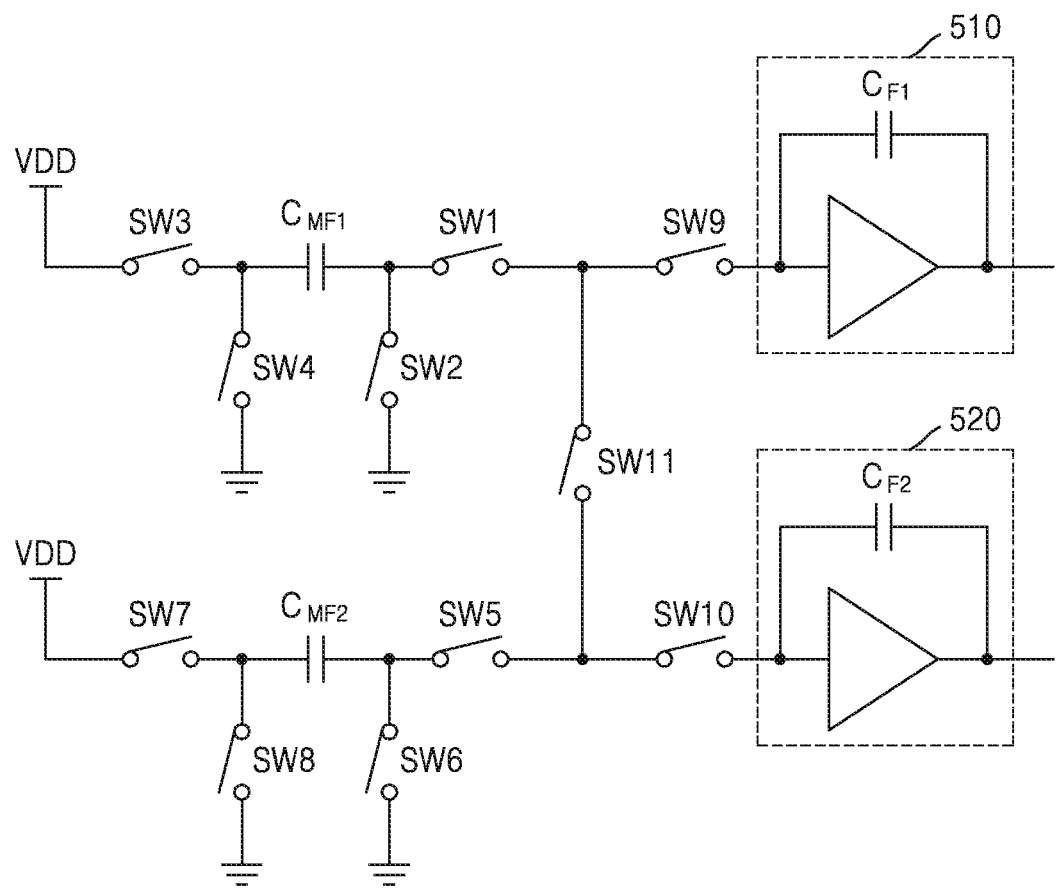
FIG. 8 is a configuration diagram of an integrator circuit device in a touch and fingerprint sensor, according to an example embodiment.

FIG. 8 is a configuration diagram of an integrator circuit device in a touch and fingerprint sensor, according to an example embodiment.

A touch panel according to an example embodiment may include k sampling capacitors. The k sampling capacitors may be connected in parallel and may have the same capacitance, but example embodiments are not limited thereto. In FIG. 8, for convenience of description, a case in which the touch panel includes two sampling capacitors will be described.

Referring to FIG. 8, each of a first sampling capacitor $C_{MF1}$ and a second sampling capacitor $C_{MF2}$ may be a sampling capacitor for sensing a fingerprint input. In addition, the integrator circuit device may include a first integrator 510 and a second integrator 520, which perform integration on a charge quantity stored in the first sampling capacitor $C_{MF1}$ and a charge quantity stored in the second sampling capacitor $C_{MF2}$ in a positive direction or a negative direction.

The first integrator 510 according to an example embodiment may be connected to the first sampling capacitor $C_{MF1}$ through a ninth switch SW9 and a first switch SW1 connected in series to each other, and may be connected to the second sampling capacitor $C_{MF2}$ through the ninth switch SW9, an eleventh switch SW11, and a fifth switch SW5 connected in series to one another.

In addition, the second integrator 520 may be connected to the first sampling capacitor $C_{MF1}$ through a tenth switch SW10, the eleventh switch SW11, and the first switch SW1 connected in series to one another, and may be connected to the second sampling capacitor $C_{MF2}$ through the tenth switch SW10 and the fifth switch SW5 connected in series to each other.

For example, a fingerprint input is to be sensed, the integrator circuit device may perform integration on the charge quantity stored in the first sampling capacitor $C_{MF1}$ in a positive direction or a negative direction through the first integrator 510 by turning off the eleventh switch SW11 and controlling first to fourth switches SW1 to SW4 in the same manner as described with reference to FIGS. 4 and 5. In addition, the integrator circuit device may perform integration on the charge quantity stored in the second sampling capacitor $C_{MF2}$ in the positive direction or the negative direction through the second integrator 520 by controlling fifth to eighth switches SW5 to SW8 in the same manner as described with reference to FIGS. 4 and 5. Furthermore, the integrator circuit device may perform integration a preset number of times (N times) and determine a final output voltage corresponding to the first sampling capacitor $C_{MF1}$ and a final output voltage corresponding to the second sampling capacitor $C_{MF2}$, based on a voltage output from each of the first integrator 510 and the second integrator 520 and the number of times an integration direction changed.

When a touch input is to be sensed, the integrator circuit device may perform integration on the charge quantity stored in the first sampling capacitor $C_{MF1}$ and the charge quantity stored in the second sampling capacitor $C_{MF2}$ in the positive direction or the negative direction through the first integrator 510 by turning on the ninth switch SW9 and the eleventh switch SW11, turning off the tenth switch SW10, and controlling the first to eighth switches SW1 to SW8 in the same manner as described with reference to FIGS. 4 and 5. In this case, the integrator circuit device may operate the first switch SW1 in the same state as the fifth switch SW5, operate the second switch SW2 in the same state as the sixth switch SW6, operate the third switch SW3 in the same state as the seventh switch SW7, and operate the fourth switch SW4 in the same state as the eighth switch SW8.

In addition, the integrator circuit device may perform integration a preset number of times (N times) and determine a final output voltage corresponding to the first sampling capacitor $C_{MF1}$ and the second sampling capacitor $C_{MF2}$, based on a voltage output from the first integrator 510 and the number of times an integration direction changed.

The integrator circuit device may perform integration on the charge quantity stored in the first sampling capacitor $C_{MF1}$ and the charge quantity stored in the second sampling capacitor $C_{MF2}$ in the positive direction or the negative direction through the second integrator 520 by turning off the ninth switch SW9, turning on the tenth switch SW10 and the eleventh switch SW11, and controlling the first to eighth switches SW1 to SW8 in the same manner as described with reference to FIGS. 4 and 5. In this case, the integrator circuit device may operate the first switch SW1 in the same state as the fifth switch SW5, operate the second switch SW2 in the same state as the sixth switch SW6, operate the third switch SW3 in the same state as the seventh switch SW7, and operate the fourth switch SW4 in the same state as the eighth switch SW8.

Furthermore, the integrator circuit device may perform integration a preset number of times (N times) and determine a final output voltage corresponding to the first sampling capacitor $C_{MF1}$ and the second sampling capacitor $C_{MF2}$, based on a voltage output from the second integrator 520 and the number of times an integration direction changed.

Figure 9A:
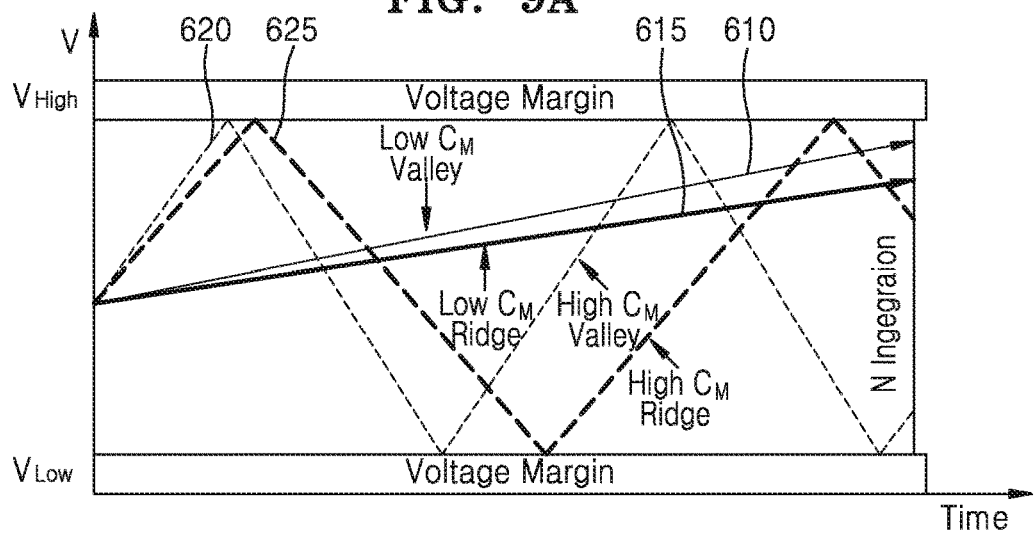
FIGS. 9A, 9B, and 9C are graphs showing output voltages of an integrator according to an example embodiment.
Figure 9B:
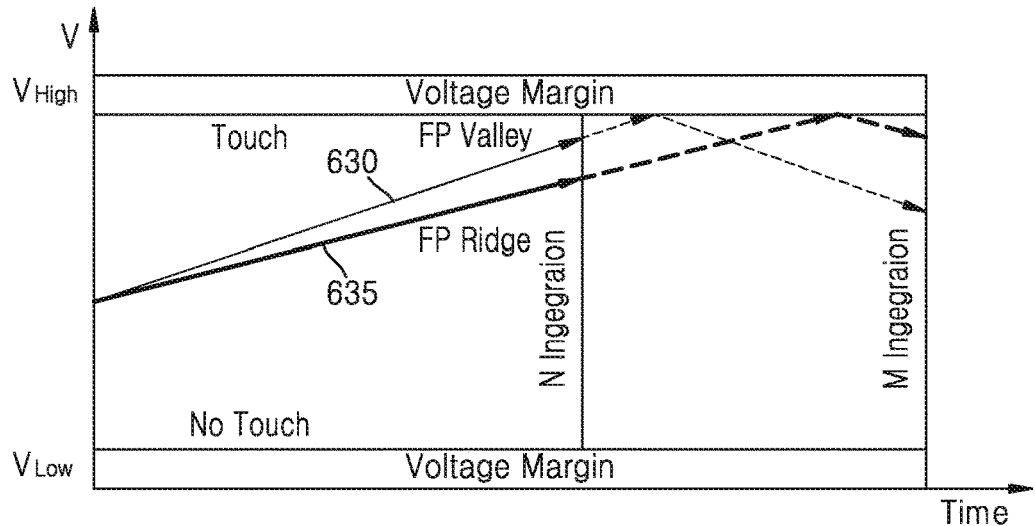
Figure 9C:
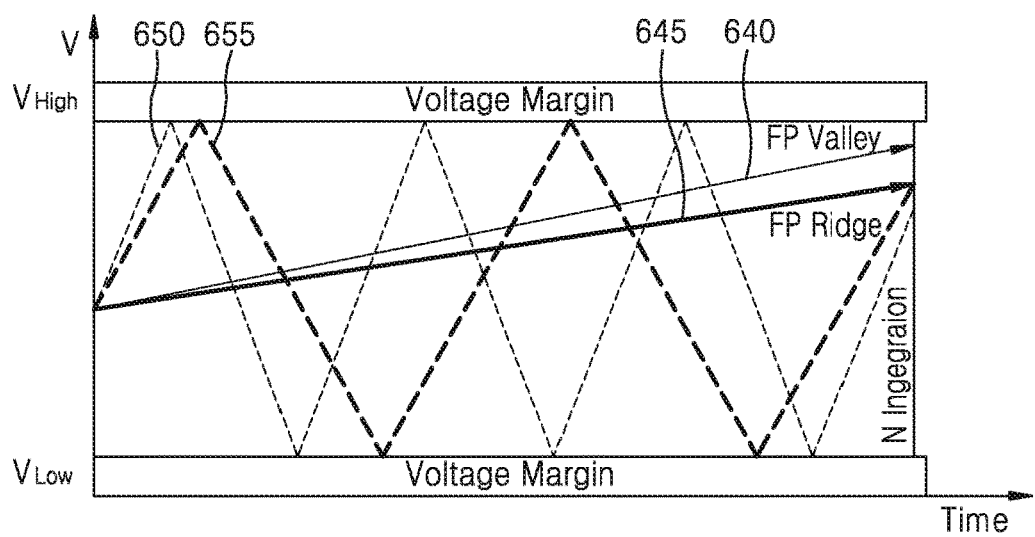

FIGS. 9A, 9B, and 9C are graphs showing output voltages of an integrator according to an example embodiment.

FIG. 9A is a graph showing the output voltages of the integrator with respect to a time when a mutual capacitor has various capacitances ($C_M$).

In FIG. 9A, first and second solid-line graphs 610 and 615 indicate a case in which the capacitance of the mutual capacitor is a first value. The first solid-line graph 610 indicates a case ($C_M$) in which there is no change in the capacitance of the mutual capacitor, and the second solid-line graph 615 indicates a case ($C_M$-$\Delta C_M$) in which the capacitance of the mutual capacitor decreases. For example, when there is a touch input or a fingerprint input, the capacitance of the mutual capacitor decreases in a mutual capacitive type.

In addition, in FIG. 9A, first and second dashed-line graphs 620 and 625 indicate a case in which the mutual capacitance of the mutual capacitor is a second value greater than the first value. The first dashed-line graph 620 indicates a case in which there is no change in the capacitance of the mutual capacitor (for example, in a case in which there is no touch input or the like), and the second dashed-line graph 625 indicates a case in which the capacitance of the mutual capacitor decreases (for example, in a case in which there is a touch input or the like).

Referring to FIG. 9A, when the capacitance of the mutual capacitor is a first value, a voltage obtained by performing integration N times may be between a preset first threshold voltage $V_{Low}$ and a preset second threshold voltage $V_{High}$ (for example, within an allowable output voltage range of the integrator).

On the other hand, when the capacitance of the mutual capacitor is a second value, an integrated voltage before integration is performed N times may reach the first threshold voltage $V_{Low}$ or the second threshold voltage $V_{High}$. When the integrated voltage reaches the first threshold voltage $V_{Low}$ or the second threshold voltage $V_{High}$, the integrator circuit device 100 according to the example embodiment may continuously perform integration regardless of the allowable output voltage range of the integrator by changing the integration direction of the integrator. In addition, after the integrator circuit device 100 performs integration N times, the integrator circuit device 100 may determine a final output voltage by taking into account a voltage output from the integrator and the number of times the integration direction changed.

Even when the capacitance of the mutual capacitor or a change in the capacitance of the mutual capacitor is large, the integration direction may be changed to expand a dynamic range of the final output voltage without increasing a capacitance of a feedback capacitor or reducing a voltage difference between both terminals of the mutual capacitor. Therefore, the integrator circuit device 100 according to the example embodiment may sense an input signal by using the same integrator, regardless of the capacitance of the mutual capacitor.

FIG. 9B is a graph showing an output voltage of the integrator with respect to a time when the number of times of integration is varied.

In FIG. 9B, sections indicated by solid lines in first and second graphs 630 and 635 indicate a case in which integration is performed N times (for example, in a case in which there is no touch input), and sections indicated by dashed lines indicate a case in which integration is performed M times (where M is greater than N). When the number of times of integration increases, a signal-to-noise ratio (SNR) may increase. In addition, the first graph 630 indicates a case ($C_M$) in which there is no change in the capacitance of the mutual capacitors, and the second graph 635 indicates a case ($C_M$-$\Delta C_M$) in which the capacitance of the mutual capacitance decreases.

Referring to FIG. 9B, when the integration is performed N times, a voltage obtained by performing the integration N times may be between a preset first threshold voltage $V_{low}$ and a preset second threshold voltage $V_{High}$ (for example, within an allowable output voltage range of the integrator).

On the other hand, when the integration is performed M times, an integrated voltage before the integration is performed M times may reach the second threshold voltage $V_{High}$. Therefore, when the integrated voltage reaches the second threshold voltage $V_{High}$, the integrator circuit device 100 may continuously perform integration regardless of the allowable output voltage range of the integrator by changing the integration direction of the integrator.

After the integrator circuit device 100 perform integration M times, the integrator circuit device 100 may determine a final output voltage by taking into account a voltage output from the integrator and the number of times the integration direction changed.

Even when the number of times of the integration increases, it is possible to expand a dynamic range of the final output voltage regardless of the allowable output voltage range of the integrator. Therefore, the integrator circuit device 100 according to the example embodiment may sense an input signal by using the same integrator, regardless of the number of times of integration.

FIG. 9C is a graph showing output voltages of the integrator with respect to a time when a touch input is sensed and a fingerprint input is sensed.

In FIG. 9C, solid-line graphs 640 and 645 indicate a case in which the fingerprint input is sensed. The first solid-line graph 640 indicates a case in which there is no fingerprint input, and the second solid-line graph 645 indicates a case in which there is the fingerprint input.

In addition, in FIG. 9C, dashed-line graphs 650 and 655 indicate a case in which the touch input is sensed. The first dashed-line graph 650 indicates a case in which there is no touch input, and the second dashed-line graph 655 indicates a case in which there is the touch input.

Referring to FIG. 9C, in the case of the fingerprint input, a voltage obtained by performing integration N times may be between a preset first threshold voltage $V_{Low}$ and a preset second threshold voltage $V_{High}$ (for example, within an allowable output voltage range of the integrator).

On the other hand, in the case of the touch input, an integrated voltage before the integration is performed N times may reach the first threshold voltage $V_{Low}$ or the second threshold voltage $V_{High}$. When the integrated voltage reaches the first threshold voltage $V_{Low}$ or the second threshold voltage $V_{High}$, the integrator circuit device 100 according to the example embodiment may continuously perform integration regardless of the allowable output voltage range of the integrator by changing the integration direction of the integrator. In addition, after the integrator circuit device 100 may perform integration N times, the integrator circuit device 100 may determine a final output voltage by taking into account a voltage output from the integrator and the number of times the integration direction changed.

Even when the touch input is sensed, the integration direction may be changed to expand a dynamic range of the final output voltage without increasing a capacitance of a feedback capacitor or reducing a voltage difference between both terminals of the mutual capacitor. Therefore, the integrator circuit device 100 according to the example embodiment may sense the touch input and the fingerprint input by using the same integrator without using separate integrators.

Figure 10:
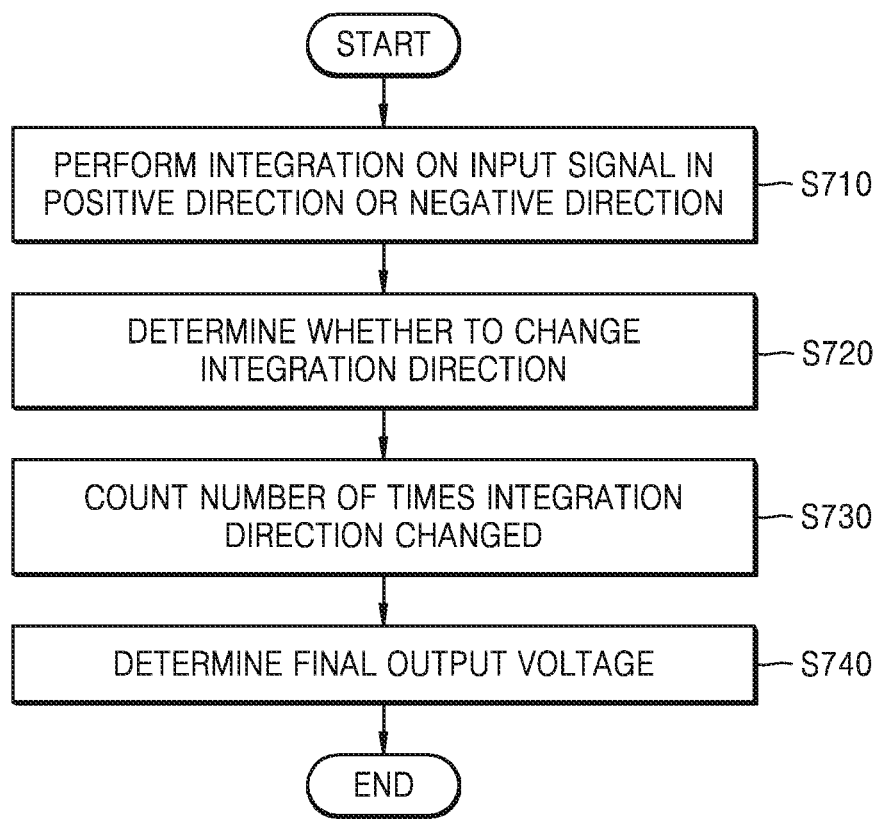
FIG. 10 is a flowchart of an operating method of an integrator circuit device, according to an example embodiment.

FIG. 10 is a flowchart of an operating method of the integrator circuit device 100, according to an example embodiment.

Referring to FIG. 10, the integrator circuit device 100 may perform integration on an input signal in a positive direction or a negative direction (S710).

The integrator circuit device 100 may include an integrator. The integrator may include an operational amplifier and a feedback capacitor. An input terminal of the operational amplifier may be connected to a mutual capacitor $C_M$ through switches.

The integrator circuit device 100 may perform integration on a charge quantity stored in the mutual capacitor $C_M$ in the positive direction or the negative direction through switching of the switches. The integrator circuit device 100 may determine whether to change an integration direction of the integrator (S720).

The integrator circuit device 100 may compare a voltage output from the integrator with a preset voltage and determine whether to change the integration direction of the integrator. For example, when the voltage output from the integrator is greater than a first threshold voltage and less than a second threshold voltage, the integrator circuit device 100 may maintain the integration direction without changing the integration direction. On the other hand, when the voltage output from the integrator is less than or equal to the first threshold voltage or greater than or equal to the second threshold voltage, the integrator circuit device 100 may change the integration direction. In this case, the first threshold voltage and the second threshold voltage may be determined based on a minimum threshold voltage and a maximum threshold voltage capable of operating the operational amplifier.

The integrator circuit device 100 may count the number of times the integration direction changed (S730).

The integrator circuit device 100 may determine a final output voltage (S740).

The integrator circuit device 100 may convert the voltage output from the integrator into a digital signal and determine the final output voltage, based on the digital signal and the number of times the integration direction changed.

Figure 11:
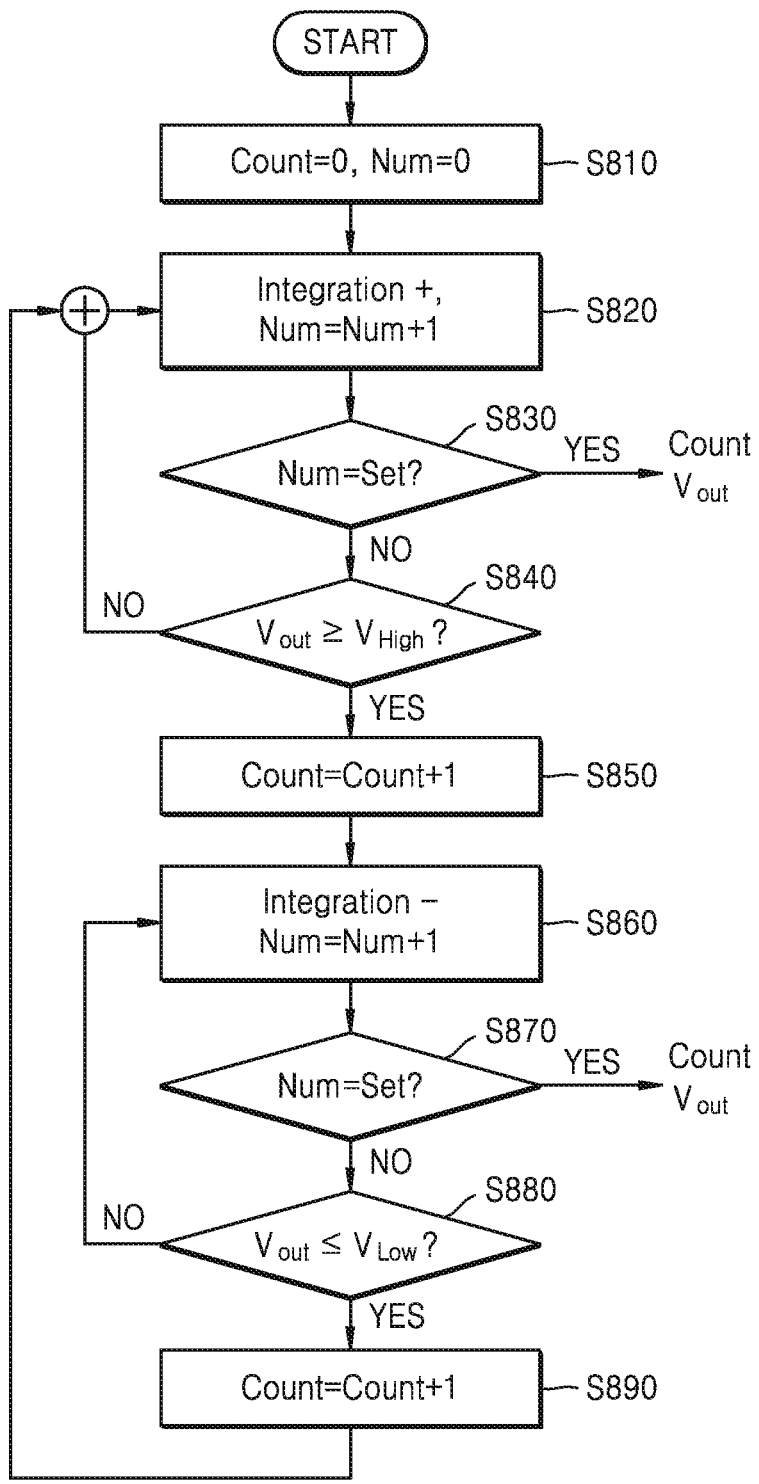
FIG. 11 is a flowchart of an operating method of an integrator circuit device when the integrator circuit device sets an initial integration direction to a positive direction, according to an example embodiment.

FIG. 11 is a flowchart of an operating method of the integrator circuit device 100 when the integrator circuit device 100 sets an initial integration direction to a positive direction, according to an example embodiment.

Referring to FIG. 11, the integrator circuit device 100 may set an initial value of each of the number of times (Count) an integration direction changed and the number of times of integration (Num) to be zero (S810). The integrator circuit device 100 may perform integration on an input signal in the positive direction and increment the number of times of integration (Num) by one (S820). The integrator circuit device 100 may determine whether the number of times of integration (Num) is equal to a preset number of times (Set) (S830). When the number of times of integration (Num) is equal to the preset number of times (Set), the integrator circuit device 100 may output a voltage output from an integrator and the number of times of integration (Num). In addition, the integrator circuit device 100 may output the number of times (Count) the integration direction changed.

When the number of times of integration (Num) is not equal to the preset number of times (Set), the integrator circuit device 100 may determine whether the voltage output from the integrator is greater than or equal to a second threshold voltage ($V_{High}$) (S840). When the voltage output from the integrator is less than the second threshold voltage ($V_{High}$), the integrator circuit device 100 may continuously perform integration on the input signal in the positive direction.

When the voltage output from the integrator is greater than or equal to the second threshold voltage ($V_{High}$), the integrator circuit device 100 may increment the number of times (Count) the integration direction changed by one (S850). The integrator circuit device 100 may perform integration on the input signal in a negative direction and increment the number of times of integration (Num) by one (S860). The integrator circuit device 100 may determine whether the number of times of integration (Num) is equal to a preset number of times (Set) (S870). When the number of times of integration (Num) is equal to the preset number of times (Set), the integrator circuit device 100 may output the voltage output from the integrator and the number of times of integration (Num). In addition, the integrator circuit device 100 may output the number of times (Count) the integration direction changed.

When the number of times of integration (Num) is not equal to the preset number of times (Set), the integrator circuit device 100 may determine whether the voltage output from the integrator is less than or equal to a first threshold voltage ($V_{Low}$) (S880). When the voltage output from the integrator is greater than the first threshold voltage ($V_{Low}$), the integrator circuit device 100 may continuously perform integration on the input signal in the negative direction.

When the voltage output from the integrator is less than or equal to the first threshold voltage ($V_{Low}$), the integrator circuit device 100 may increment the number of times (Count) the integration direction changed by one (S890). The integrator circuit device 100 may perform integration on the input signal in the positive direction.

Figure 12:
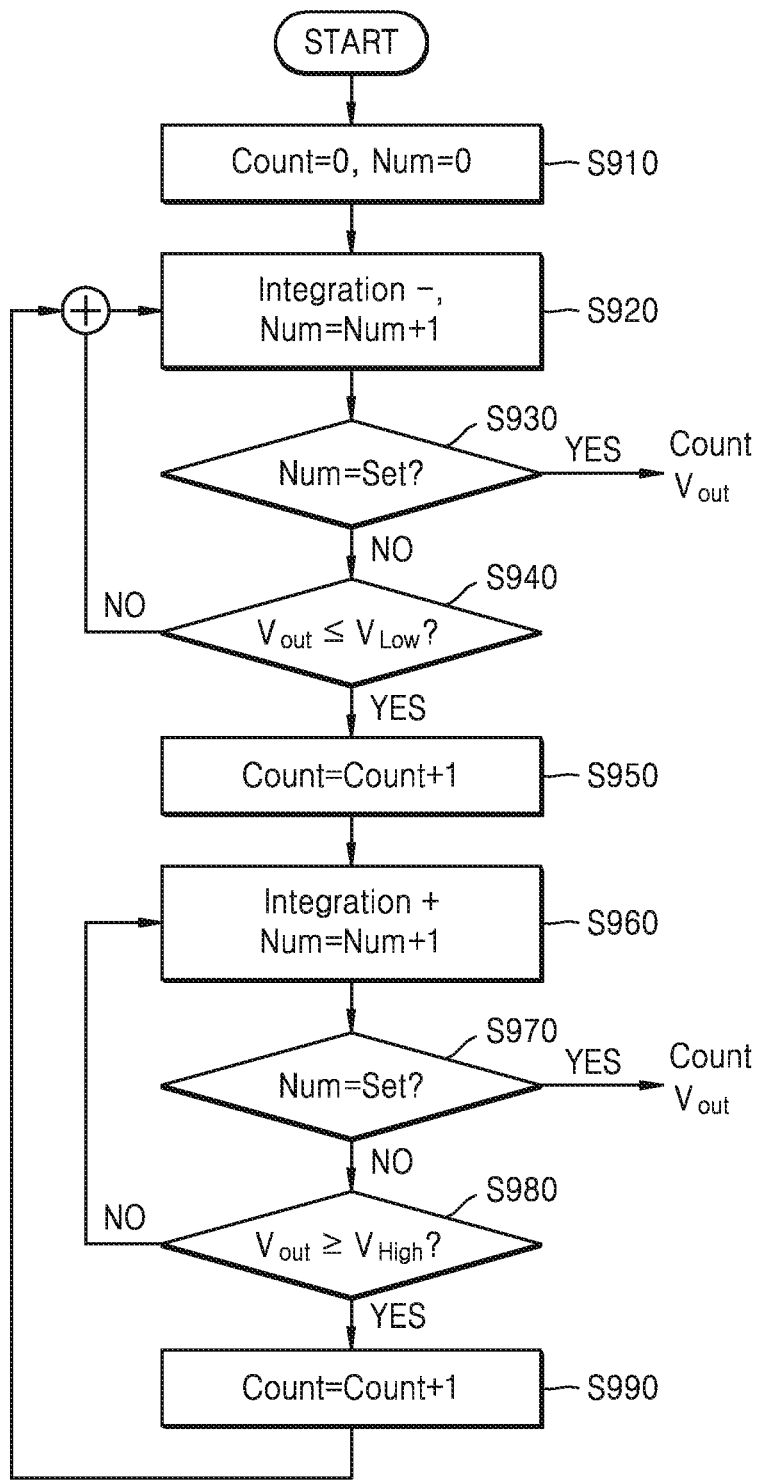
FIG. 12 is a flowchart of an operating method of an integrator circuit device when the integrator circuit device sets an initial integration direction to a negative direction, according to an example embodiment.

FIG. 12 is a flowchart of an operating method of the integrator circuit device 100 when the integrator circuit device 100 sets an initial integration direction to a negative direction, according to an example embodiment.

Referring to FIG. 12, the integrator circuit device 100 may set an initial value of each of the number of times (Count) an integration direction changed and the number of times of integration (Num) to be zero (S910). The integrator circuit device 100 may perform integration on an input signal in the negative direction and increment the number of times of integration (Num) by one (S920). The integrator circuit device 100 may determine whether the number of times of integration (Num) is equal to a preset number of times (Set) (S930). When the number of times of integration (Num) is equal to the preset number of times (Set), the integrator circuit device 100 may output a voltage output from the integrator and the number of times of integration (Num). In addition, the integrator circuit device 100 may output the number of times (Count) the integration direction changed.

When the number of times of integration (Num) is not equal to the preset number of times (Set), the integrator circuit device 100 may determine whether the voltage output from the integrator is less than or equal to a first threshold voltage ($V_{Low}$) (S940). When the voltage output from the integrator is greater than the first threshold voltage ($V_{Low}$), the integrator circuit device 100 may continuously perform integration on the input signal in the negative direction.

When the voltage output from the integrator is less than or equal to the first threshold voltage ($V_{Low}$), the integrator circuit device 100 may increment the number of times (Count) the integration direction changed by one (S950). The integrator circuit device 100 may perform integration on the input signal in a positive direction and increment the number of times of integration (Num) by one (S960). The integrator circuit device 100 may determine whether the number of times of integration (Num) is equal to a preset number of times (Set) (S970). When the number of times of integration (Num) is equal to the preset number of times (Set), the integrator circuit device 100 may output the voltage output from the integrator and the number of times of integration (Num). In addition, the integrator circuit device 100 may output the number of times (Count) the integration direction changed.

When the number of times of integration (Num) is not equal to the preset number of times (Set), the integrator circuit device 100 may determine whether the voltage output from the integrator is greater than or equal to a second threshold voltage ($V_{High}$) (S980). When the voltage output from the integrator is less than the second threshold voltage ($V_{High}$), the integrator circuit device 100 may continuously perform integration on the input signal in the positive direction.

When the voltage output from the integrator is greater than or equal to the second threshold voltage ($V_{High}$), the integrator circuit device 100 may increment the number of times (Count) the integration direction changed by one (S990). The integrator circuit device 100 may perform integration on the input signal in the negative direction.

The operating method of the integrator circuit device according to the example embodiment can also be embodied as compute-readable codes on a non-transitory computer-readable recording medium. The non-transitory computer-readable recording medium is any data storage device that can store data that can be thereafter read by a computer system. Examples of the non-transitory computer-readable recording medium include read-only memory (ROM), random-access memory (RAM), CD-ROMs, magnetic tapes, floppy disks, and optical data storage devices. The non-transitory processor-readable recording medium can also be distributed over network coupled computer systems so that the processor-readable code is stored and executed in a distributed fashion.

It may be understood that the example embodiments described herein may be considered in a descriptive sense only and not for purposes of limitation. Descriptions of features or aspects within each example embodiment may be considered as available for other similar features or aspects in other example embodiments.

While the example embodiments have been described with reference to the figures, it will be understood by those of ordinary skill in the art that various changes in form and details may be made therein without departing from the spirit and scope as defined by the following claims.

What is claimed is:

1. An integrator circuit device comprising:
an integrator connected to a first terminal of a mutual capacitor through a first switch, wherein a first voltage is applied to the first terminal of the mutual capacitor through a second switch, a second voltage is applied to a second terminal of the mutual capacitor through a third switch, and a third voltage is applied to the second terminal of the mutual capacitor through a fourth switch;
a switching controller configured to:
turn on the first switch and the fourth switch, and turn off the second switch and the third switch, in a first time section; and
turn off the first switch and the fourth switch, and turn on the second switch and the third switch, in a second time section,
wherein the integrator is configured to perform an integration on an input signal in a positive direction in a time section including the first time section and the second time section that alternately repeat on a time axis, to generate an output voltage;
a comparator configured to compare the output voltage generated by the integrator, with a preset voltage,
wherein the switching controller is further configured to control the first switch, the second switch, the third switch and the fourth switch, based on a result of the output voltage being compared with the preset voltage, so that the integrator performs the integration on the input signal in a negative direction;
a counter configured to count a number of times an integration direction of the integrator is changed; and
a controller configured to determine a final output voltage, based on an initial integration direction of the integrator, the counted number of times the integration direction is changed, and the output voltage generated by the integrator.

2. The integrator circuit device of claim 1, wherein the preset voltage comprises a first threshold voltage and a second threshold voltage that is greater than the first threshold voltage, and
the switching controller is further configured to, in response to the output voltage generated by the integrator being less than or equal to the first threshold voltage or greater than or equal to the second threshold voltage, control the first switch, the second switch, the third switch and the fourth switch to change the integration direction of the integrator.

3. The integrator circuit device of claim 1, wherein the preset voltage comprises a first threshold voltage and a second threshold voltage that is greater than the first threshold voltage, and
the switching controller is further configured to, in response to the output voltage generated by the integrator being greater than the first threshold voltage and less than the second threshold voltage, control the first switch, the second switch, the third switch and the fourth switch to maintain the integration direction of the integrator.

4. The integrator circuit device of claim 1, wherein the preset voltage comprises a first threshold voltage and a second threshold voltage that is greater than the first threshold voltage,
the comparator is further configured to:
output a first signal to the switching controller, in response to the output voltage generated by the integrator being greater than the first threshold voltage and less than the second threshold voltage; and
output a second signal to the switching controller, in response to the output voltage generated by the integrator being less than or equal to the first threshold voltage or greater than or equal to the second threshold voltage.

5. The integrator circuit device of claim 1, wherein the integrator comprises an operational amplifier, and a feedback capacitor connected to an input terminal and an output terminal of the operation amplifier, and
the input terminal of the operational amplifier is connected to the first terminal of the mutual capacitor through the first switch.

6. The integrator circuit device of claim 1, wherein the integrator is further configured to perform the integration on the input signal a preset number of times, and
the controller is further configured to determine the final output voltage, based on the counted number of times the integration direction is changed and the output voltage generated by the integrator, in response to the integrator performing the integration on the input signal the preset number of times.

7. The integrator circuit device of claim 1, further comprising an analog-to-digital converter configured to convert the output voltage generated by the integrator into a digital signal.

8. An integrator circuit device comprising:
an integrator connected to a first terminal of a mutual capacitor through a first switch, wherein a first voltage is applied to the first terminal of the mutual capacitor through a second switch, a second voltage is applied to a second terminal of the mutual capacitor through a third switch, and a third voltage is applied to the second terminal of the mutual capacitor through a fourth switch;
a switching controller configured to:
turn on the first switch and the third switch, and turn off the second switch and the fourth switch, in a first time section; and
turn off the first switch and the third switch, and turn on the second switch and the fourth switch, in a second time section,
wherein the integrator is configured to perform an integration on an input signal in a negative direction in a time section including the first time section and the second time section that alternately repeat on a time axis to generate an output voltage;
a comparator configured to compare the output voltage generated by the integrator, with a preset voltage,
wherein the switching controller is further configured to control the first switch, the second switch, the third switch and the fourth switch, based on a result of the output voltage being compared with the preset voltage, so that the integrator performs the integration on the input signal in a positive direction;
a counter configured to count a number of times an integration direction of the integrator is changed; and
a controller configured to determine a final output voltage, based on an initial integration direction of the integrator, the counted number of times the integration direction is changed, and the output voltage generated by the integrator.

9. An operating method of an integrator circuit device comprising an integrator connected to a first terminal of a mutual capacitor through a first switch, a first voltage being applied to the first terminal of the mutual capacitor through a second switch, a second voltage being applied to a second terminal of the mutual capacitor through a third switch, a third voltage being applied to the second terminal of the mutual capacitor through a fourth switch, and the operating method comprising:
turning on the first switch and the fourth switch, and turning off the second switch and the third switch, in a first time section;
turning off the first switch and the fourth switch, and turning on the second switch and the third switch, in a second time section;
performing, by the integrator, an integration on an input signal in a positive direction in a time section including the first time section and the second time section that alternately repeat on a time axis, to generate an output voltage;
comparing the generated output voltage with a preset voltage;
controlling the first switch, the second switch, the third switch and the fourth switch, based on a result of the output voltage being compared with the preset voltage, so that the integration is performed on the input signal in a negative direction;
counting a number of times an integration direction changed; and
determining a final output voltage, based on an initial integration direction of the integrator, the output voltage and the counted number of times the integration direction is changed.

10. The operating method of claim 9, wherein the preset voltage comprises a first threshold voltage and a second threshold voltage that is greater than the first threshold voltage, and
the controlling the first switch, the second switch, the third switch and the fourth switch comprises controlling the first switch, the second switch, the third switch and the fourth switch to change the integration direction of the integration, in response to the output voltage being less than or equal to the first threshold voltage or greater than or equal to the second threshold voltage.

11. The operating method of claim 10, wherein the controlling the first switch, the second switch, the third switch and the fourth switch further comprises:
controlling the first switch, the second switch, the third switch and the fourth switch to change the integration direction of the integration from the negative direction to the positive direction, in response to the output voltage being less than or equal to the first threshold voltage; and
controlling the first switch, the second switch, the third switch and the fourth switch to change the integration direction of the integration from the positive direction to the negative direction, in response to the output voltage being greater than or equal to the second threshold voltage.

12. The operating method of claim 9, wherein the preset voltage comprises a first threshold voltage and a second threshold voltage that is greater than the first threshold voltage, and the controlling the first switch, the second switch, the third switch and the fourth switch further comprises controlling the first switch, the second switch, the third switch and the fourth switch to maintain the integration direction of the integration, in response to the output voltage being greater than the first threshold voltage and less than the second threshold voltage.

\* \* \* \* \*